(12) United States Patent
Park et al.

(10) Patent No.: US 11,309,326 B2
(45) Date of Patent: Apr. 19, 2022

(54) VERTICAL SEMICONDUCTOR DEVICE

(71) Applicant: Samsung Electronics Co., Ltd., Suwon-si (KR)

(72) Inventors: Jo-young Park, Seoul (KR); Chang-seok Kang, Seongnam-si (KR); Chang-sup Lee, Hwaseong-si (KR); Se-mee Jang, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 210 days.

(21) Appl. No.: 16/832,389

(22) Filed: Mar. 27, 2020

(65) Prior Publication Data

US 2020/0227430 A1    Jul. 16, 2020

Related U.S. Application Data

(63) Continuation of application No. 16/416,319, filed on May 20, 2019, now Pat. No. 10,658,374, which is a continuation of application No. 15/620,870, filed on Jun. 13, 2017, now Pat. No. 10,297,543.

(30) Foreign Application Priority Data

Dec. 14, 2016  (KR) .......................... 10-2016-0170416

(51) Int. Cl.
| | | |
|---|---|---|
| H01L 27/11575 | (2017.01) | |
| H01L 27/11548 | (2017.01) | |
| H01L 27/11556 | (2017.01) | |
| H01L 27/11582 | (2017.01) | |
| H01L 23/522 | (2006.01) | |
| H01L 23/528 | (2006.01) | |

(Continued)

(52) U.S. Cl.
CPC .. *H01L 27/11575* (2013.01); *H01L 27/11548* (2013.01); *H01L 21/76816* (2013.01); *H01L 21/76877* (2013.01); *H01L 23/528* (2013.01); *H01L 23/5226* (2013.01); *H01L 27/11524* (2013.01); *H01L 27/11556* (2013.01); *H01L 27/11582* (2013.01)

(58) Field of Classification Search
None
See application file for complete search history.

(56) References Cited

U.S. PATENT DOCUMENTS

| | | |
|---|---|---|
| 8,008,732 B2 | 8/2011 | Kiyotoshi et al. |
| 9,202,780 B2 | 12/2015 | Lee et al. |
| 9,293,172 B2 | 3/2016 | Lee et al. |

(Continued)

*Primary Examiner* — Whitney Moore
(74) *Attorney, Agent, or Firm* — Muir Patent Law, PLLC

(57) ABSTRACT

A vertical semiconductor device including a plurality of interlayer insulating layer patterns spaced apart from each other on a substrate and stacked in a vertical direction; a plurality of conductive layer patterns arranged between the interlayer insulating layer patterns and each having a rounded end, wherein at least one of the conductive layer patterns is configured to extend from one side wall of each of the interlayer insulating layer patterns and include a pad region, and the pad region includes a raised pad portion configured to protrude from a surface of the at least one conductive layer pattern; an upper interlayer insulating layer to cover the interlayer insulating layer patterns and the conductive layer patterns; and a contact plug configured to penetrate the upper interlayer insulating layer to be in contact with the raised pad portion of the at least one conductive layer pattern.

20 Claims, 25 Drawing Sheets

(51) Int. Cl.
*H01L 27/11524* (2017.01)
*H01L 21/768* (2006.01)

(56) References Cited

U.S. PATENT DOCUMENTS

| | | |
|---|---|---|
| 9,356,038 B2 | 5/2016 | Lee et al. |
| 2013/0234232 A1 | 9/2013 | Yahashi |
| 2015/0255385 A1 | 9/2015 | Lee et al. |
| 2016/0079257 A1 | 3/2016 | Sonehara |
| 2017/0133399 A1 | 5/2017 | Kim et al. |

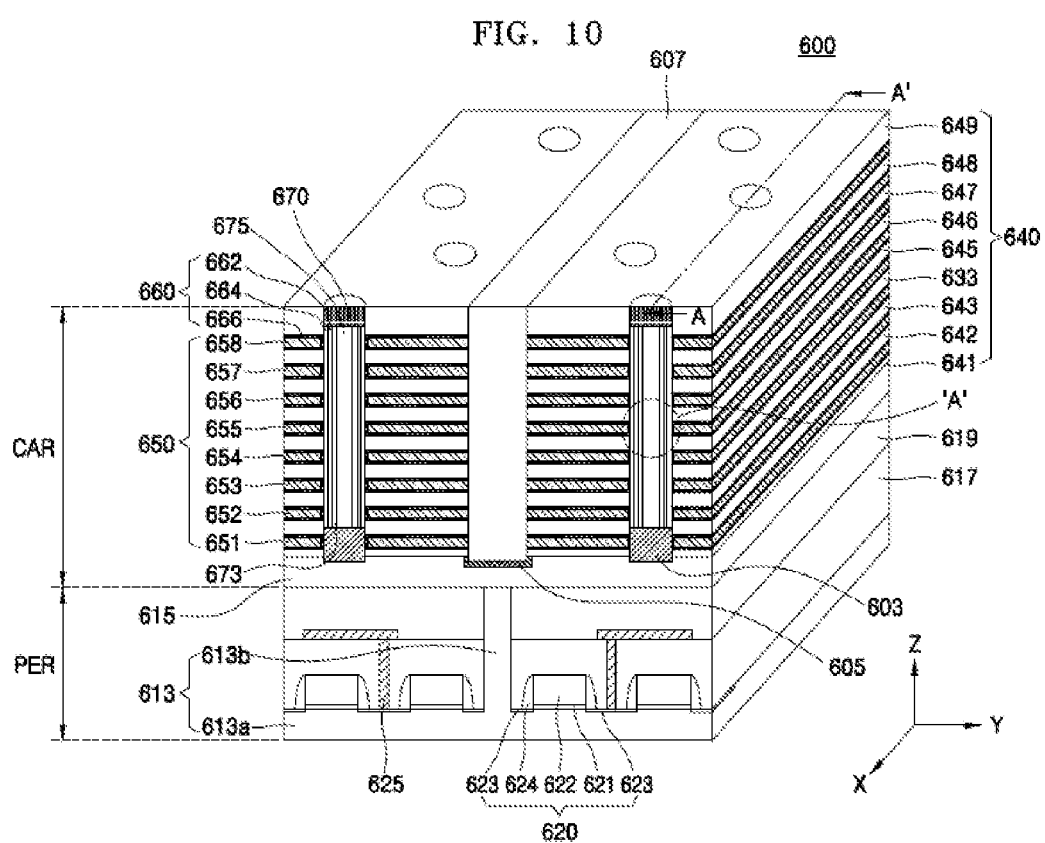

VERTICAL SEMICONDUCTOR DEVICE

CROSS-REFERENCE TO RELATED APPLICATION

This application is a continuation application of U.S. patent application Ser. No. 16/416,319, filed May 20, 2019, which is a continuation application of U.S. patent application Ser. No. 15/620,870, filed Jun. 13, 2017, which claims the benefit of priority to Korean Patent Application No. 10-2016-0170416, filed on Dec. 14, 2016, in the Korean Intellectual Property Office, the disclosure of each of which is incorporated herein in its entirety by reference.

BACKGROUND

The inventive concept relates to a semiconductor device, and more particularly, to a vertical semiconductor device.

A vertical semiconductor device, in which memory cells are stacked in a direction perpendicular to a surface of a substrate, may include a connection wiring that is formed by contacting a conductive layer pattern included in each of memory cells with a contact plug such that an electrical signal is independently applied to each of the memory cells. As semiconductor devices have become highly integrated, it is difficult to form a connection wiring with a contact plug on each of vertically stacked conductive layer patterns.

SUMMARY

The present disclosure provides a vertical semiconductor device capable of easily forming a connection wiring with a contact plug on each of vertically stacked conductive layer patterns.

According to an aspect of example embodiments of the herein described subject matter, there is provided a vertical semiconductor device including a plurality of interlayer insulating layer patterns spaced apart from each other on a substrate and stacked in a vertical direction; a plurality of conductive layer patterns arranged between the interlayer insulating layer patterns and each having a rounded end, wherein at least one of the conductive layer patterns is configured to extend from one side wall of each of the interlayer insulating layer patterns and include a pad region, and the pad region includes a raised pad portion configured to protrude from a surface of the at least one conductive layer pattern; an upper interlayer insulating layer to cover the interlayer insulating layer patterns and the conductive layer patterns; and a contact plug configured to penetrate the upper interlayer insulating layer to be in contact with the raised pad portion of the at least one conductive layer pattern.

According to another example embodiment, there is provided a vertical semiconductor device including a vertical structure configured to protrude in a vertical direction on a substrate of the cell block region and including a channel layer; a plurality of conductive layer patterns configured to extend into a connection region while surrounding the vertical structure and stacked while being spaced apart from each other by interlayer insulating layer patterns in the vertical direction; and a plurality of contact plugs, each of which is in contact with a pad region which is an edge of the conductive layer patterns of each layer, wherein one end of each of the conductive layer patterns is rounded, and the pad region includes a raised pad portion protruding from a surface of each of the conductive layer patterns.

BRIEF DESCRIPTION OF THE DRAWINGS

The example embodiments will be more clearly understood from the following detailed description taken in conjunction with the accompanying drawings in which:

FIG. 10 is a partial perspective view of a vertical semiconductor device according to an example embodiment;

DETAILED DESCRIPTION

Figure 1:
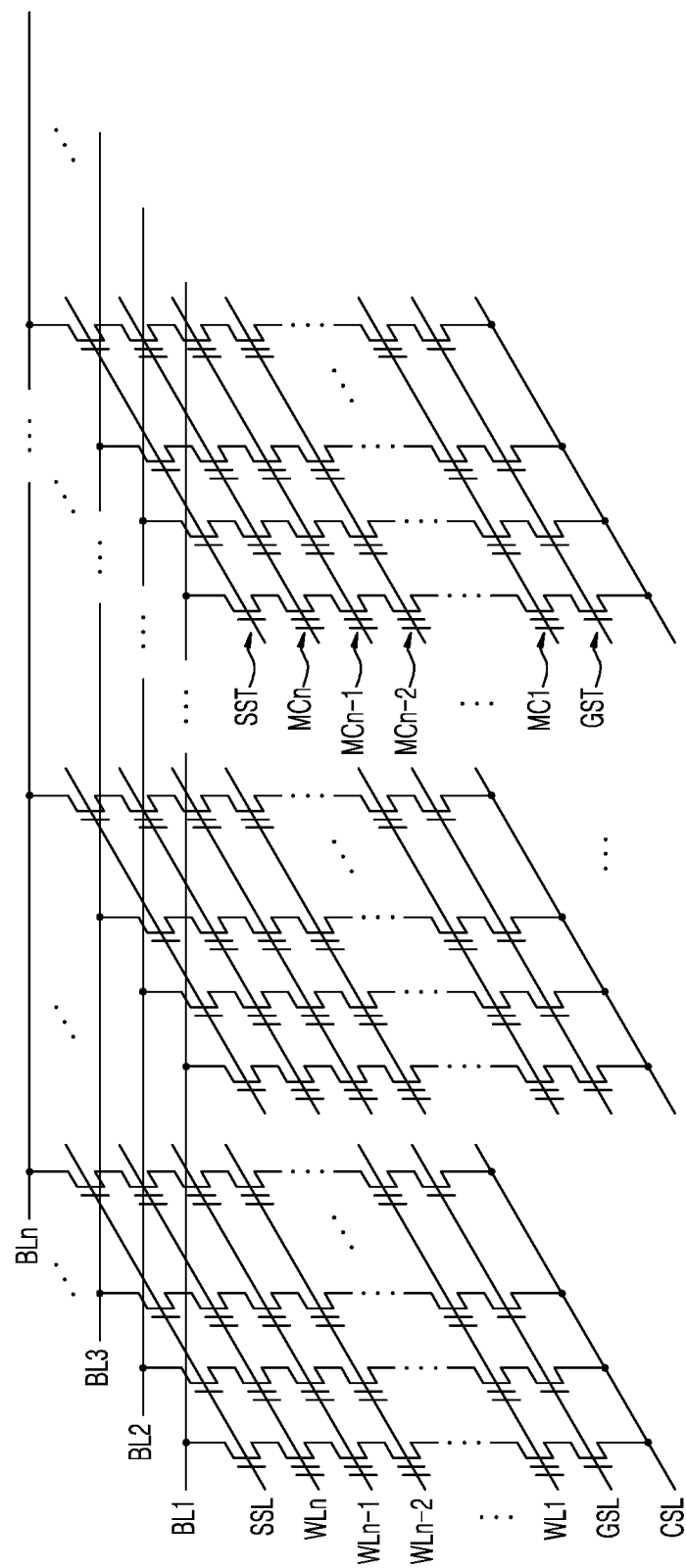
FIG. 1 is an equivalent circuit diagram of a memory cell array of a vertical semiconductor device, according to an example embodiment.

The present disclosure now will be described more fully hereinafter with reference to the accompanying drawings, in which various exemplary embodiments are shown. The invention may, however, be embodied in many different forms and should not be construed as limited to the exemplary embodiments set forth herein. These example exemplary embodiments are just that-examples-and many embodiments and variations are possible that do not require the details provided herein. It should also be emphasized that the disclosure provides details of alternative examples, but such listing of alternatives is not exhaustive. Furthermore, any consistency of detail between various exemplary embodiments should not be interpreted as requiring such detail-it is impracticable to list every possible variation for every feature described herein. The language of the claims should be referenced in determining the requirements of the invention.

In the drawings, the size and relative sizes of layers and regions may be exaggerated for clarity. Like numbers refer to like elements throughout. Though the different figures show variations of exemplary embodiments, these figures are not necessarily intended to be mutually exclusive from each other. Rather, as will be seen from the context of the detailed description below, certain features depicted and described in different figures can be combined with other features from other figures to result in various embodiments, when taking the figures and their description as a whole into consideration.

Although the figures described herein may be referred to using language such as "one embodiment," or "certain embodiments," these figures, and their corresponding descriptions are not intended to be mutually exclusive from other figures or descriptions, unless the context so indicates. Therefore, certain aspects from certain figures may be the same as certain features in other figures, and/or certain figures may be different representations or different portions of a particular exemplary embodiment.

The terminology used herein is for the purpose of describing particular exemplary embodiments only and is not intended to be limiting of the invention. As used herein, the singular forms "a", "an" and "the" are intended to include the plural forms as well, unless the context clearly indicates otherwise. As used herein, the term "and/or" includes any and all combinations of one or more of the associated listed items and may be abbreviated as "/".

It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present. Other words used to describe the relationship between elements should be interpreted in a like fashion (e.g., "between" versus "directly between," "adjacent" versus "directly adjacent," etc.).

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Also these spatially relative terms such as "above" and "below" as used herein have their ordinary broad meanings—for example element A can be above element B even if when looking down on the two elements there is no overlap between them (just as something in the sky is generally above something on the ground, even if it is not directly above).

FIG. 1 is an equivalent circuit diagram of a memory cell array of a vertical semiconductor device, according to an example embodiment.

In more detail, the memory cell array may include n memory cells MC1 through MCn connected in series with each other, and a plurality of memory cell strings including a ground selection transistor GST and a string selection transistor SST that are connected in series to both ends of the memory cells MC1 through MCn.

The n memory cells MC1 through MCn connected in series with each other may be connected to word lines WL1 through WLn for selecting at least some of the memory cells MC1 through MCn. A gate terminal of the ground selection transistor GST may be connected to a ground selection line GSL and a source terminal may be connected to a common source line CSL. Meanwhile, a gate terminal of the string selection transistor SST may be connected to a string selection line SSL, and a source terminal may be connected to a drain terminal of the memory cell device MCn. FIG. 1 shows a structure in which the ground selection transistor GST and the string selection transistor SST are connected to the n memory cells MC1 through MCn connected in series with each other. Alternatively, a plurality of ground selection transistors GST or a plurality of string selection transistors SST may be connected thereto.

A drain terminal of the string selection transistor SST may be connected to bit lines BL1 through BLm. When a signal is applied to the gate terminal of the string selection transistor SST through the string selection line SSL, signals applied through the bit lines BL1 through BLm are transferred to the n memory cells MC1 through MCn connected in series with each other so that a data read or write operation may be performed. In addition, an erase operation for removing all charges stored in the n memory cells MC1 through MCn may be executed by applying a signal to the gate terminal of the gate selection transistor GST through a gate selection line GSL, in which the source terminal of the gate selection transistor GST is connected to the common source line CSL.

Figure 2:
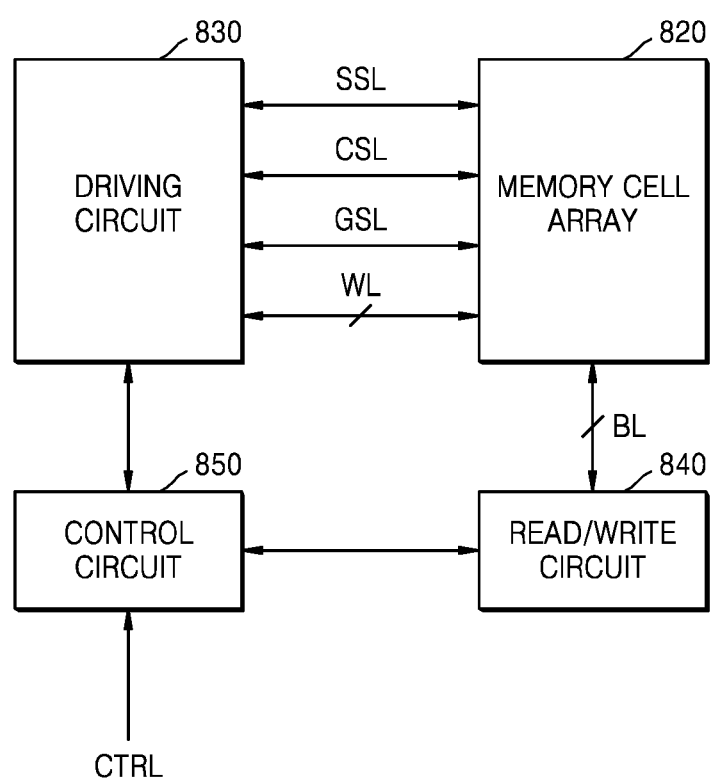
FIG. 2 is a block diagram of a vertical semiconductor device according to an example embodiment.

FIG. 2 is a block diagram of a vertical semiconductor device according to an example embodiment.

In more detail, the vertical semiconductor device may include a memory cell array 820, a driving circuit 830, a read/write circuit 840, and a control circuit 850. The memory cell array 820 may include a plurality of memory cells, and the plurality of memory cells may be arranged along a plurality of rows and columns. The plurality of memory cells included in the memory cell array 820 may be connected to the driving circuit 830 through a word line WL, the common source line CSL, the string selection line SSL, and the ground selection line GSL, and may be connected to the read/write circuit 840 via a bit line BL.

In an example embodiment, a plurality of memory cells arranged along an identical row may be connected to an identical word line WL and a plurality of memory cells arranged along an identical column may be connected to an identical bit line BL. The plurality of memory cells included in the memory cell array 820 may be divided into a plurality of cell blocks.

Each of the cell blocks may include a plurality of word lines WL, a plurality of string selection lines SSL, a plurality of ground selection lines GSL, a plurality of bit lines BL, and one or more common source lines CSL. The driving circuit 830 and the read/write circuit 840 may be operated by the control circuit 850.

In an example embodiment, the driving circuit 830 may receive address information from the outside and may decode the received address information to select at least some of a word line WL, a common source line CSL, a string selection line SSL, and a ground selection line GSL that are connected to the memory cell array 820. The driving circuit 830 may include a circuit for driving each of the word line WL, the string selection line SSL, and the common source line CSL.

The read/write circuit 840 may select at least some of the bit lines BL connected to the memory cell array 820 according to instructions received from the control circuit 850. The read/write circuit 840 may read data stored in a memory cell connected to at least some of the selected bit lines BL or may write data into a memory cell connected to at least some of the selected bit lines BL. The read/write circuit 840 may include circuits such as a page buffer, an input/output buffer, a data latch, etc. to perform the above operations.

The control circuit 850 may control operations of the driving circuit 830 and the read/write circuit 840 in response to a control signal CTRL transmitted from the outside. When data stored in the memory cell array 820 is read, the control circuit 850 may control the operation of the driving circuit 830 so as to supply a reading voltage to the word line WL of the memory cell in which is stored data to be read. When the reading voltage for a read operation is supplied to a specific word line WL, the control circuit 850 may control the read/write circuit 840 to read the data stored in the memory cell connected to the word line WL supplied with the reading voltage for a read operation.

Meanwhile, when writing data to the memory cell array 820, the control circuit 850 may control the operation of the driving circuit 830 to supply a writing voltage for a writing operation to a word line WL in which data is to be written. When the writing voltage for a write operation is supplied to a specific word line WL, the control circuit 850 may control the read/write circuit 840 to write data to the memory cell connected to the word line WL to which the writing voltage for a write operation is supplied.

Figure 3:
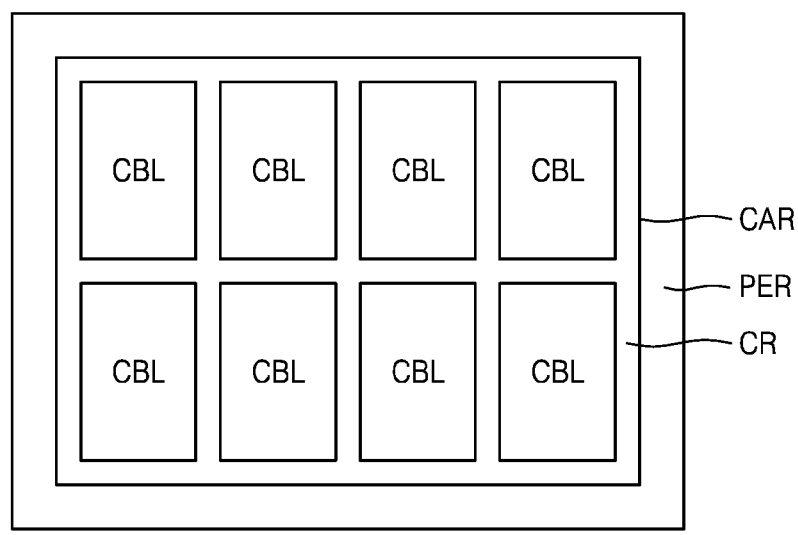
FIG. 3 is a plan view of a vertical semiconductor device according to an example embodiment.
Figure 4A:
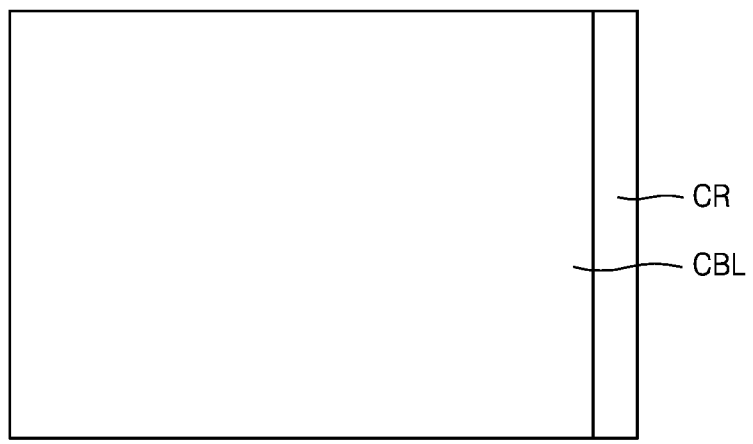
FIGS. 4A through 4C are plan views of an arrangement of a cell block region and a connection region in a cell array region of FIG. 3.
Figure 4B:
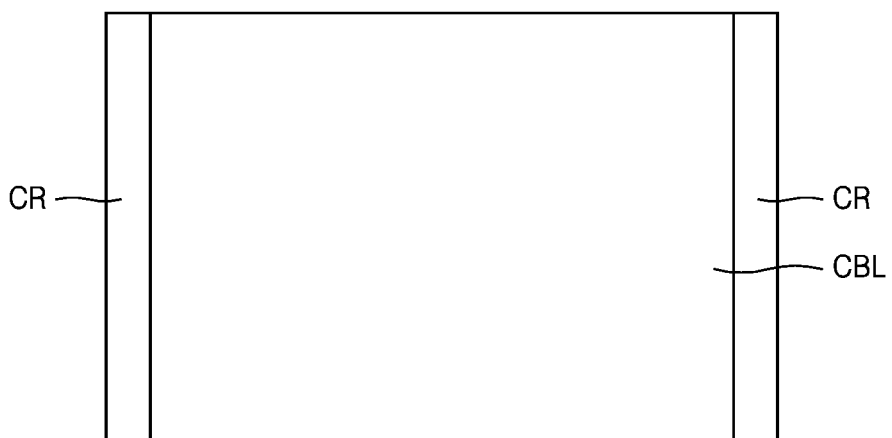
Figure 4C:
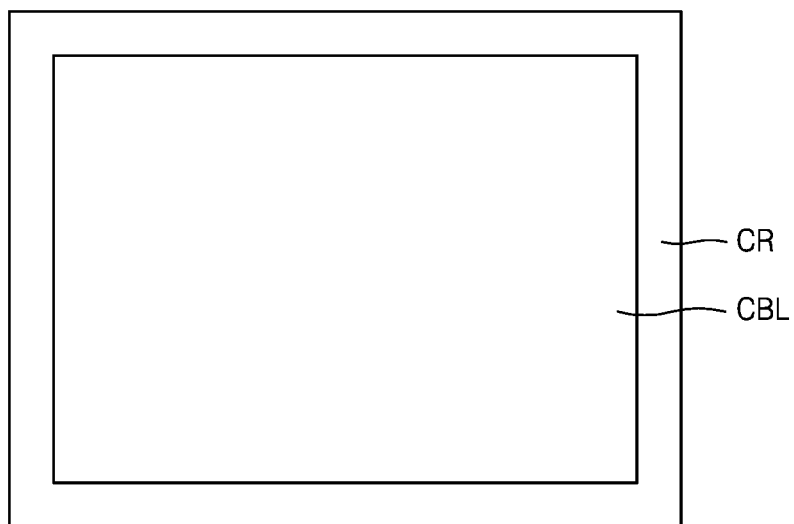

FIG. 3 is a plan view of a vertical semiconductor device according to an example embodiment of the inventive concept, and FIGS. 4A through 4C are plan views of an arrangement of a cell block region and a connection region in a cell array region of FIG. 3.

In more detail, as shown in FIG. 3, the vertical semiconductor device includes a cell array region CAR in which memory cells are arranged and a peripheral circuit region PER in which circuits for driving memory cells are arranged. In some example embodiments, the cell array region CAR and the peripheral circuit region PER may be formed apart from each other on an identical substrate. In some example embodiments, the cell array region CAR may be vertically stacked on an upper side of the peripheral circuit region PER.

The cell array region CAR may include a plurality of cell block regions CBL and a connection region CR. Each cell block region CBL is formed with memory cells and the connection region CR is arranged around the cell block region CBL so that wirings connected to conductive lines (or conductive layer patterns) extending from the memory cells are facilitated.

As shown in FIGS. 4A through 4C, the connection region CR may be arranged adjacent to a side wall of the cell block region CBL. For example, as shown in FIG. 4A, the connection region CR may be arranged at a side of the cell block region CBL. As shown in FIG. 4B, the connection region CR may be arranged at two facing sides of the cell block region CBL to face each other. As shown in FIG. 4C, the connection region CR may be arranged to surround the cell block region CBL.

In a case of the vertical semiconductor device, each of the memory cells formed in the cell block region CBL may be stacked in a vertical direction. Vertically stacked conductive layer patterns (or conductive lines) included in each of the memory cells typically have independent electrical signals applied thereto, respectively. The conductive layer patterns may be a word line, a string selection line, or a ground selection line as described above. To this end, the conductive layer patterns have a shape extending horizontally to the connection region CR and a portion extended to the connection region CR should be formed so as to be connected to respective contact plugs.

Hereinafter, although various types of connection regions of a vertical semiconductor device will be described, the following example embodiments are not limited thereto. A connection region described later below may be explained using a conductive layer pattern, for example, a contact plug which is in contact with a gate electrode.

Figure 5:
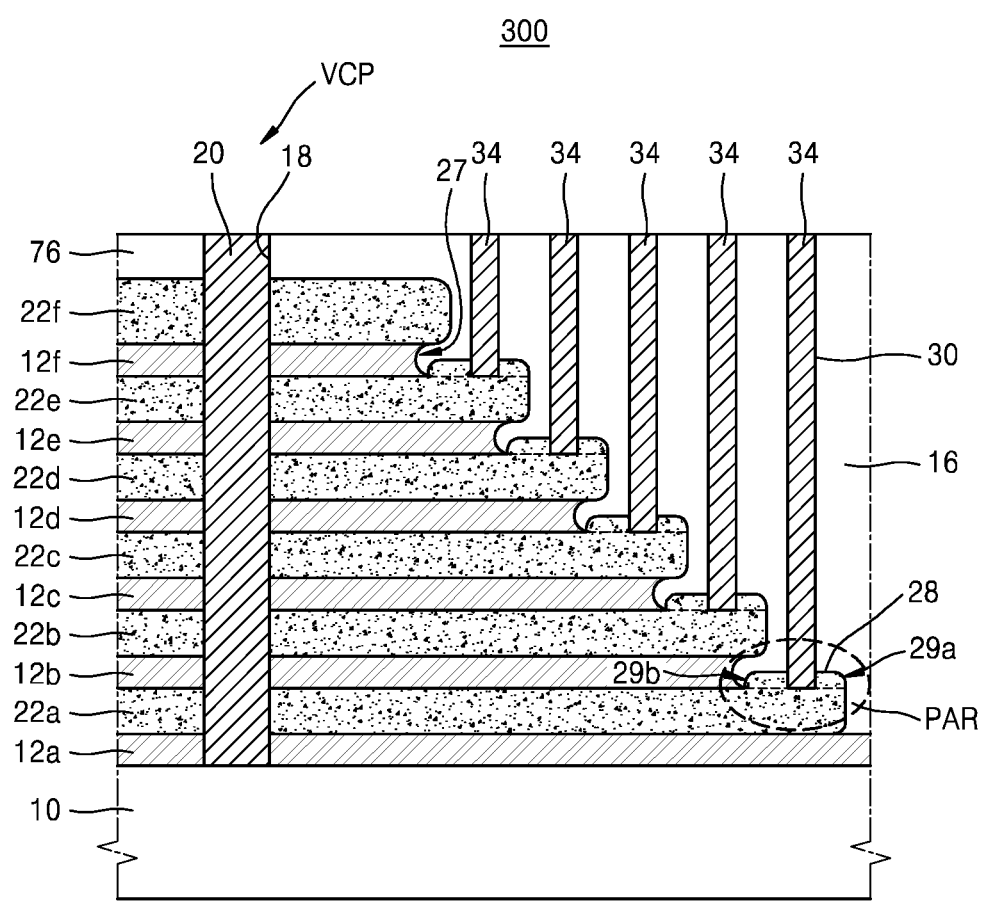
FIG. 5 is a partial cross-sectional view of a connection region of a vertical semiconductor device according to an example embodiment.

FIG. 5 is a partial cross-sectional view showing a connection region of a vertical semiconductor device 300 according to an example embodiment.

In more detail, the vertical semiconductor device 300 may be provided with a stepped conductive structure in which interlayer insulating layer patterns 12a through 12f and conductive layer patterns 22a through 22f are repeatedly stacked on a substrate 10 in a vertical direction.

The substrate 10 may include a semiconductor material, for example, a group IV semiconductor, a group III-V compound semiconductor, or a group II-VI oxide semiconductor. For example, when the substrate 10 includes a group IV semiconductor, the substrate 10 may be a silicon substrate. The substrate 10 may also be provided as a bulk wafer or an epitaxial layer.

The number of layers in which the interlayer insulating layer patterns 12a through 12f and the conductive layer patterns 22a through 22f are stacked is not limited. Each of the interlayer insulating layer patterns 12a through 12f may include a recessed portion 27 recessed from a side wall of each of the conductive layer patterns 22a through 22f. It may be advantageous to prevent a short circuit between the conductive layer patterns 22a through 22f when the recessed portion 27 is formed.

A hole 18 may be formed in the cell block region CBL through the interlayer insulating layer patterns 12a through 12f and the conductive layer patterns 22a through 22f. A channel layer 20 may be formed in the hole 18. Accordingly, a vertical structure VCP including the channel layer 20 on the substrate 10 may be formed in the cell block region CBL.

The conductive layer patterns 22a through 22f may extend into the connection region CR while surrounding the vertical structure VCP. The connection region CR may be formed on one side, another side, or the periphery of the cell block region CBL as shown in FIG. 4A. The conductive layer patterns 22a through 22f may be a word line, a string selection line, or a ground selection line as described above.

Each of the conductive layer patterns 22a through 22f may have a pad region PAR in which a contact is formed on at least one edge in the connection region CR. One end of each of the conductive layer patterns 22a through 22f of the connection region CR may be rounded. One end of each of the conductive layer patterns 22a through 22f may be rounded through an oxidation process and an ion implantation process as described later below.

The conductive layer patterns 22a through 22f formed at a lower portion of the vertical semiconductor device 300 may protrude laterally farther than the conductive layer patterns 22a through 22f formed at an upper portion of the vertical semiconductor device 300. The conductive layer patterns 22a through 22f formed at a lower portion may extend laterally farther than the conductive layer patterns 22a through 22f formed at an upper portion.

Each of the conductive layer patterns 22a through 22f formed at a lower portion may be formed with the pad region PAR extending from one side wall of each of the interlayer insulating layer patterns 12a to 12f formed at an upper portion. The conductive layer patterns 22a through 22f may be configured to be shorter in a horizontal direction as a distance from the substrate 10 increases. For example, a horizontal distance of the conductive layer patterns 22a through 22f may become shorter as the conductive layer patterns 22a through 22f get farther away from the substrate 10, and the conductive layer patterns 22a through 22f may have a stepped form.

The pad region PAR may include a raised pad portion 28 protruding from a surface of each of the conductive layer patterns 22a through 22f. The raised pad portion 28 extends in a horizontal direction of one side of each of the interlayer insulating layer patterns 12b through 12f. One end 29a of the raised pad portion 28 extends farther than the interlayer insulating layer patterns 12b through 12e formed at a lower portion. The raised pad portion 28 may partially overlap the conductive layer patterns 22b through 22f formed at an upper portion due to the recessed portion 27. The raised pad portion 28 may occupy the entire portion exposed by the conductive layer patterns 22b through 22f formed at an upper portion.

The one end 29a and another end 29b of the raised pad portion 28 are rounded. The raised pad portion 28 may prevent a short circuit between the adjacent conductive layer patterns 22a through 22f when the other end 29b is rounded adjacent to the adjacent conductive layer patterns 22a through 22f. The raised pad portion 28 may be formed on a surface of each of the conductive layer patterns 22a through 22f through an oxidation process and an ion implantation process as described later below. The conductive layer patterns 22a through 22f may include a metal material. For example, the metal material included in the conductive layer patterns 22a through 22f constituting the conductive structure may include tungsten, aluminum, copper, or the like.

The vertical semiconductor device 300 may include an upper interlayer insulating layer 16 covering the conductive structure. The upper interlayer insulating layer 16 may be formed to cover the interlayer insulating layer patterns 12a through 12f and the conductive layer patterns 22a through 22f. The upper interlayer insulating layer 16 may fill the recessed portion 27 formed in each of the interlayer insulating layer patterns 12a through 12f. The vertical semiconductor device 300 includes contact holes 30 that penetrate the upper interlayer insulating layer 16 and expose upper surfaces of the conductive layer patterns 22a through 22f. A contact plug 34 may be formed in each of the contact holes 30. The contact plug 34 includes a metal material. For example, the metal material included in the contact plug 34 may be tungsten, aluminum, or copper.

When one end of each of the conductive layer patterns 22a through 22f constituting the vertical semiconductor device 300 is rounded, a short circuit between the adjacent conductive layer patterns 22a through 22f may be prevented. Furthermore, when the pad region PAR of the vertical semiconductor device 300 includes the raised pad portion 28 as in the described example embodiments, it is possible to prevent a short circuit phenomenon in which the upper contact plugs 34 are electrically connected to the lower conductive layer patterns 22a through 22f.

FIGS. 6A through 6F are partial cross-sectional views illustrating a method of manufacturing a connection region of the vertical semiconductor device 300 of FIG. 5.

Figure 6A:
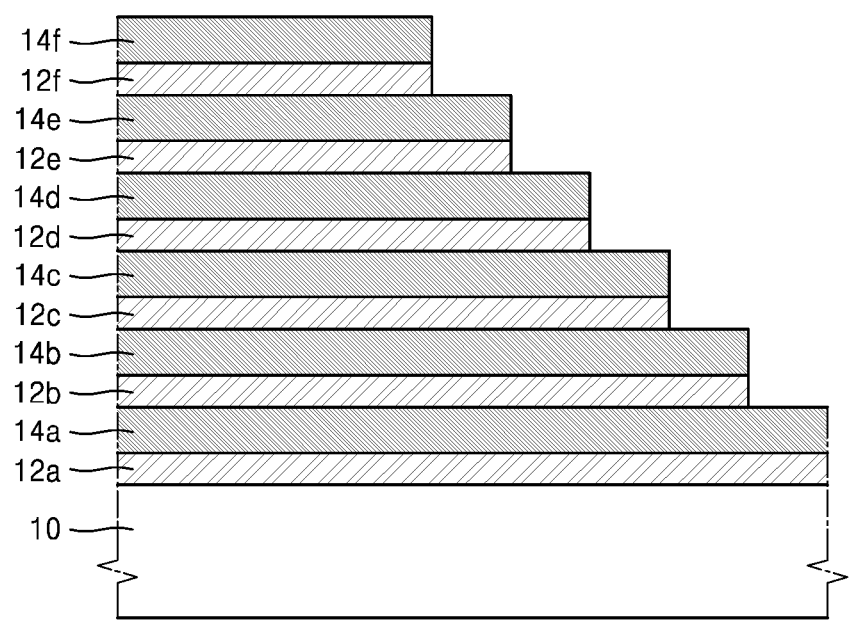
FIGS. 6A through 6F are partial cross-sectional views illustrating a method of manufacturing a connection region of the vertical semiconductor device of FIG. 5.

In more detail, the interlayer insulating layer patterns 12a through 12f and the sacrificial layer patterns 14a through 14f are sequentially and repeatedly stacked on the substrate 10 as shown in FIG. 6A. The interlayer insulating layer patterns 12a through 12f and the sacrificial layer patterns 14a through 14f may have a stepped form by repeatedly stacking interlayer insulating layers and sacrificial layers on the substrate 10, and then performing a photolithography and etching process. The photolithography and etching process may be performed several times.

The interlayer insulating layer patterns 12a through 12f may be formed of a silicon oxide layer. The sacrificial layer patterns 14a through 14f may be formed of a material having an etching selectivity with respect to the interlayer insulating layer patterns 12a through 12f. The sacrificial layer patterns 14a through 14f may be formed of a material such as a silicon nitride layer or a polysilicon layer. The interlayer insulating layer patterns 12a through 12f and the sacrificial layer patterns 14a through 14f may be formed by a deposition process such as chemical vapor deposition (CVD) or atomic layer deposition (ALD).

Figure 6B:
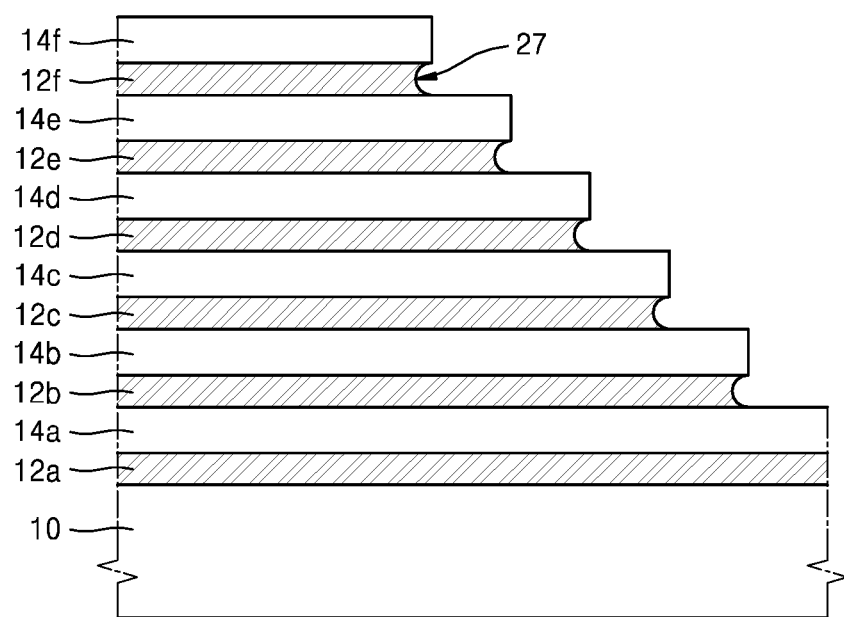

Subsequently, as shown in FIG. 6B, one end of each of the interlayer insulating layer patterns 12b through 12f may be etched to form the recessed portion 27. In some example embodiments, the recessed portion 27 may not be formed. The recessed portion 27 may be formed under one end of each of the sacrificial layer patterns 14b through 14f.

The recessed portion 27 may be formed by isotropically etching one end of each of the interlayer insulating layer patterns 12b through 12f. Since the recessed portion 27 is formed by isotropically etching one end of each of the interlayer insulating layer patterns 12b through 12f having edge portions externally exposed, the recessed portion 27 may not be formed in a part of the interlayer insulating layer pattern 12a. For example, the etched portions at the ends of the interlayer insulating layer patterns 12b through 12f can have a concave shape, and may have a curved shape.

Figure 6C:
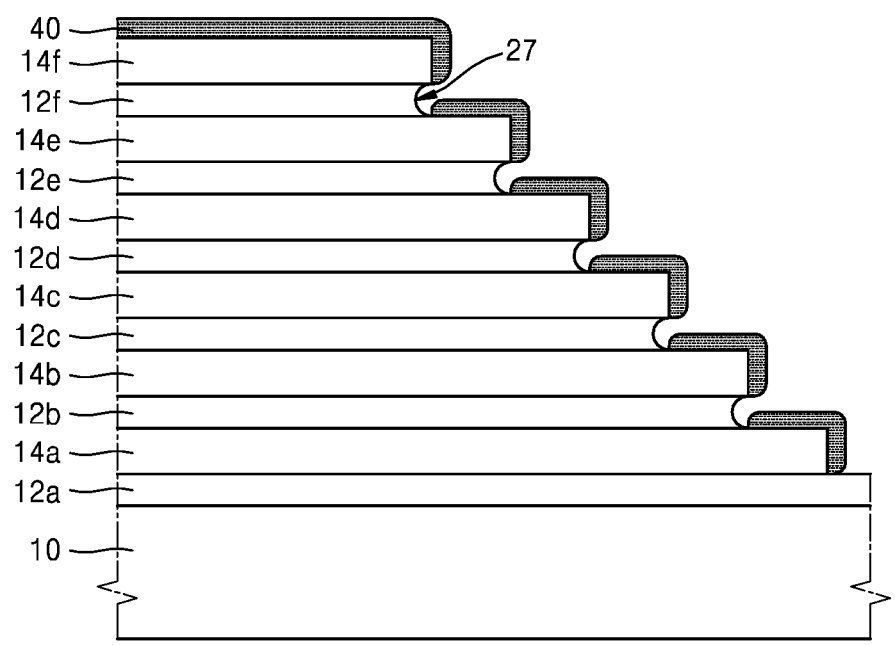

As shown in FIG. 6C, an additional insulating layer 40 is formed by oxidizing surfaces and side surfaces of the stepped sacrificial layer patterns 14a through 14f that are externally exposed. The additional insulating layer 40 may be formed by thermally oxidizing the surfaces and the side surfaces of the sacrificial layer patterns 14a through 14f. The additional insulating layer 40 may be formed on the surfaces and side surfaces of the sacrificial layer patterns 14a through 14f not covered by the interlayer insulating layer patterns 12b through 12f. One end of the additional insulating layer 40 may be rounded by an oxidation process. When one end of the additional insulating layer 40 is rounded, one end of each of conductive layer patterns in a subsequent process may be rounded to prevent a short circuit between the conductive layer patterns.

Figure 6D:
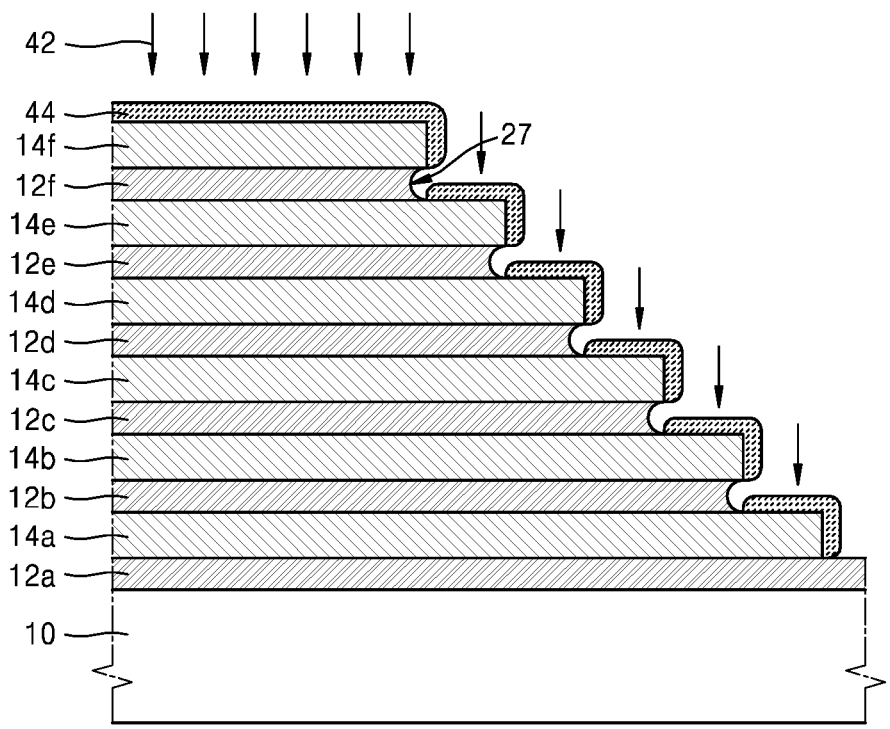

As shown in FIG. 6D, an additional sacrificial layer 44 may be formed by ion implanting impurities 42 into the additional insulating layer 40. The additional sacrificial layer 44 may be an impurity doped layer into which impurities are implanted. The additional sacrificial layer 44 may be a material layer made by changing physical properties of the additional insulating layer 40. The additional sacrificial layer 44 may be a material layer having a higher etching rate than the additional insulating layer 40.

The additional sacrificial layer 44 may be spaced apart from the interlayer insulating layer patterns 12b through 12f in a horizontal direction due to the recessed portion 27. If necessary, one end of each of the interlayer insulating layer patterns 12b through 12f may be isotropically etched to make the recessed portion 27 deeper, thereby preventing a short circuit between subsequent conductive layer patterns.

Figure 6E:
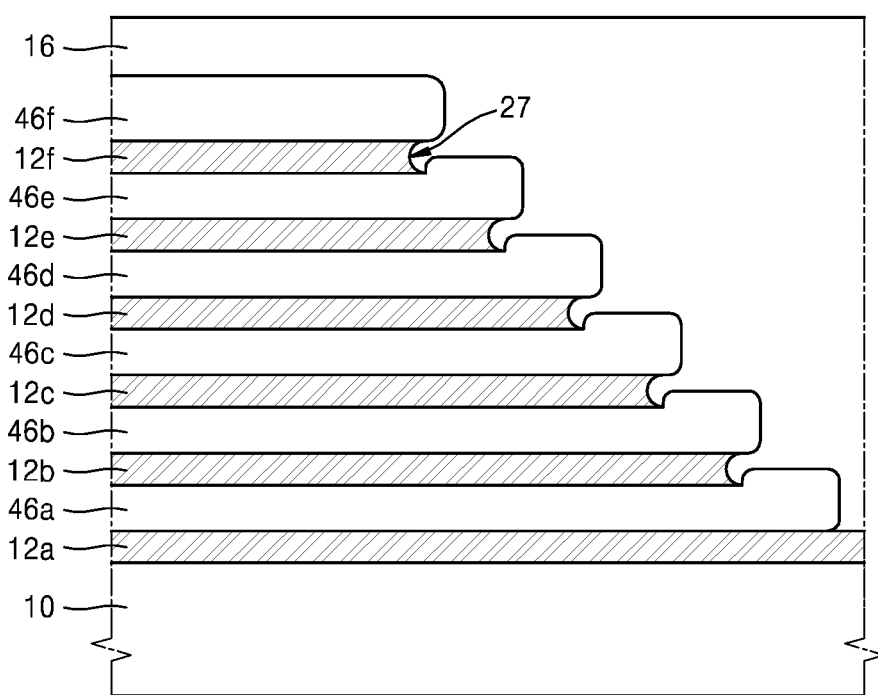

As shown in FIG. 6E, the upper interlayer insulating layer 16 is formed to cover the interlayer insulating layer patterns 12a through 12f and the sacrificial layer patterns 14a through 14f. Subsequently, grooves 46a through 46f are formed by removing the sacrificial layer patterns 14a through 14f and the additional sacrificial layer 44. The grooves 46a through 46f may be located side by side from one end to the other end of each of the sacrificial layer patterns 14a through 14f. The grooves 46a through 46f may be formed in a horizontal direction at one end of each of the interlayer insulating layer patterns 12a through 12f.

Figure 6F:
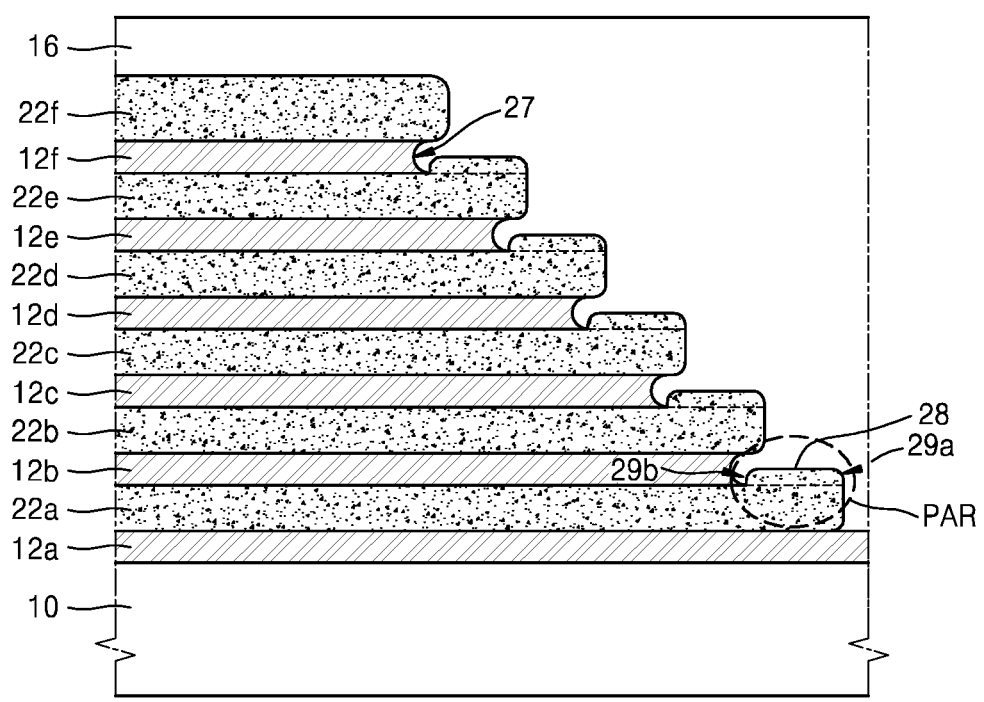

The conductive layer patterns 22a through 22f are formed so as to fill the grooves 46a to 46f as shown in FIG. 6F. The conductive layer patterns, as shown, may have top and bottom edges that are rounded, or curved, though in some embodiments, only one of the top or bottom edges may be rounded (i.e. FIG. 12). The sacrificial layer patterns 14a through 14f and the additional sacrificial layer 44 are replaced with the conductive layer patterns 22a through 22f through the above process. One end of each of the conductive layer patterns 22a through 22f may be rounded. The conductive layer patterns 22a through 22f may include the raised pad portion 28 as described above. The one end 29a and the other end 29b of the raised pad portion 28 are rounded. The raised pad portion 28 may be an extension of the material used to form the remainder (e.g., a flat horizontal portion) of each conductive layer pattern 22a through 22f, and may be integrally formed with the remainder of each conductive layer pattern 22a through 22f as part of a monolithic structure.

The raised pad portion 28 extends in a horizontal direction at one side of each of the interlayer insulating layer patterns 12b through 12f as described above. The one end 29a of the raised pad portion 28 extends farther than an adjacent interlayer insulating layer pattern (12b through 12e) formed at a lower portion of the vertical semiconductor device 300 (e.g., formed immediately below the conductive layer pattern). The raised pad portion 28 may partially overlap the conductive layer patterns 22b through 22f formed at an upper portion due to the recessed portion 27. The raised pad portion 28 may occupy the entire portion exposed by the conductive layer patterns 22b through 22f formed at an upper portion (e.g., at an immediately adjacent higher up conductive layer pattern).

Thereafter, the upper interlayer insulating layer 16 may be formed to cover the interlayer insulating layer patterns 12a through 12f and the conductive layer patterns 22a through 22f. Subsequently, the contact plug 34 penetrating the upper interlayer insulating layer 16 to be in contact with the raised pad portion 28 of the conductive layer patterns 22a through 22f is formed as shown in FIG. 5, and thus, the connection region CR (of FIGS. 3 and 4) of the vertical semiconductor device 300 may be formed. As can be seen, for example in FIG. 5, edges at ends of the conductive layer patterns 22a through 22f may be more rounded, for example, than edges of the conductive layer patterns 22a through 22f at the interface with the channel layer 20, which may form sharp angles.

Figure 7:
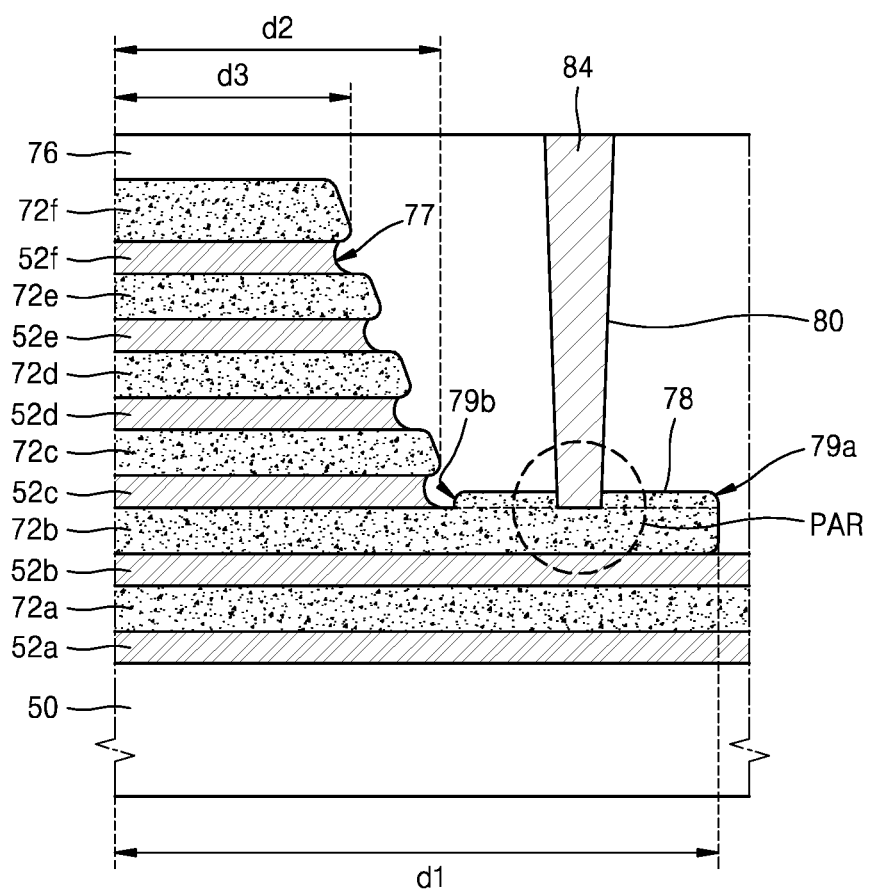
FIG. 7 is a partial cross-sectional view of a connection region of a vertical semiconductor device according to an example embodiment.

FIG. 7 is a partial cross-sectional view of a connection region of a vertical semiconductor device 400 according to an example embodiment.

In more detail, the connection region of the vertical semiconductor device 400 may be substantially the same as a connection region of the semiconductor device 300 of FIG. 5 except that interlayer insulating layer patterns 52a through 52f and conductive layer patterns 72a through 72f do not have a stepped form but are inclined. In FIG. 7, the description will be focused on portions different from FIG. 5.

A conductive structure, in which the interlayer insulating layer patterns 52a through 52f and the conductive layer patterns 72a through 72f are repeatedly stacked on a substrate 50 in a vertical direction, may be provided. The number of layers in which the interlayer insulating layer patterns 52a through 52f and the conductive layer patterns 72a through 72f are stacked is not limited. Each of the interlayer insulating layer patterns 52c through 52f may include a recessed portion 77 that is recessed from one side wall of each of the conductive layer patterns 72a through 72f. A short circuit between the conductive layer patterns 72c through 72f may be prevented when the recessed portion 77 is formed.

FIG. 7 does not show the cell block region CBL for the sake of convenience. An edge portion of the conductive layer pattern 72b from among the conductive layer patterns 72a to 72f may have the pad region PAR in which a contact is formed. The conductive layer pattern 72b may be the word line, string selection line, or ground selection line of FIGS. 1 and 2. One end of each of the conductive layer patterns 72b through 72f may be rounded, and may have rounded edges. One end of each of the conductive layer patterns 72b through 72f may be rounded through an oxidation process and an ion implantation process as described later below.

The conductive layer patterns 72c through 72f may have different horizontal distances (e.g., lateral widths) on the substrate 50. A horizontal distance d1 of the conductive layer pattern 72b on the substrate 50 may be longer than, for example, horizontal distances d2 and d3 of the conductive layer patterns 72c and 72f. The conductive layer patterns 72a and 72b may extend laterally farther than the conductive layer patterns 72c through 72f formed at an upper portion. The lateral horizontal distance may be shortened from d2 to d3 as the conductive layer patterns 72c through 72f get farther away from the substrate 50.

The conductive layer pattern 72b may be formed with the pad region PAR extending from a side wall of the interlayer insulating layer patterns 52c through 52f formed at an upper portion. The pad region PAR may include a raised pad portion 78 protruding from a surface of the conductive layer pattern 72b.

One end 79a and the other end 79b of the raised pad portion 78 are rounded. A short circuit phenomenon between the adjacent conductive layer pattern 72c and the raised pad portion 78 may be prevented when the other end 79b of the raised pad portion 78 is rounded. The raised pad portion 78 may be formed on a surface of the conductive layer pattern 72b through an oxidation process and an ion implantation process as described later below. The conductive layer patterns 72a through 72f may include a metal material. The metal material included in the conductive layer patterns 72a through 72f may include tungsten, aluminum, copper, or the like.

The vertical semiconductor device 400 may include an upper interlayer insulating layer 76 covering the conductive structure. The upper interlayer insulating layer 76 may be formed to cover the interlayer insulating layer patterns 52a through 52f and the conductive layer patterns 72a through 72f. The upper interlayer insulating layer 76 may fill the recessed portion 77 formed in each of the interlayer insulating layer patterns 52a through 52f. The vertical semiconductor device 400 includes the contact hole 80 penetrating the upper interlayer insulating layer 76 and exposing an upper surface of the conductive layer pattern 72b. A contact plug 84 may be formed in the contact hole 80. The contact plug 84 includes a metal material. The metal material included in the contact plug 84 may be tungsten, aluminum, or copper.

When one end of each of the conductive layer patterns 72a through 72f constituting the vertical semiconductor device 400 are rounded, a short circuit between the adjacent conductive layer patterns 72c through 72f may be prevented. Furthermore, when the pad region PAR of the vertical semiconductor device 400 includes the raised pad portion 78, it is possible to prevent a short circuit phenomenon in which the upper contact plug 84 is electrically connected to the lower conductive layer pattern 72a.

Figure 8:
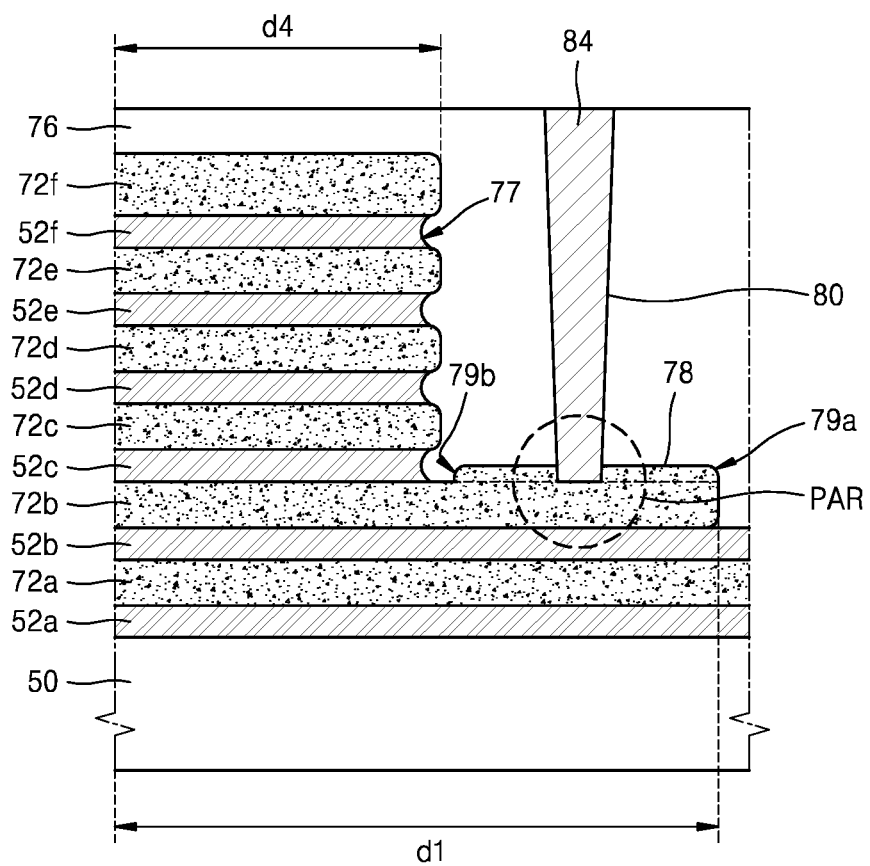
FIG. 8 is a partial cross-sectional view of a connection region of a vertical semiconductor device according to an example embodiment.

FIG. 8 is a partial cross-sectional view of a connection region of a vertical semiconductor device 500 according to an example embodiment.

In more detail, the connection region of the vertical semiconductor device 500 may be substantially the same as the connection region CR (of FIGS. 3 4) of the semiconductor device 400 of FIG. 7 except that a horizontal distance d4 of the interlayer insulating layer patterns 52c through 52f and the conductive layer patterns 72c through 72f is the same. In FIG. 8, the description will be focused on differences from the example embodiment of FIG. 7.

A conductive structure in which the interlayer insulating layer patterns 52a through 52f and the conductive layer patterns 72a through 72f are repeatedly stacked on the substrate 50 in a vertical direction. Each of the interlayer insulating layer patterns 52c through 52f may include the recessed portion 77 that is recessed from one side wall of each of the conductive layer patterns 22a through 22f.

In addition, the conductive layer patterns 72c through 72f may have the same horizontal distance d4 on the substrate 50. The horizontal distance d1 of the conductive layer pattern 72b may be longer than the horizontal distance d4 of the conductive layer patterns 72c through 72f. The conductive layer patterns 72a and 72b may extend laterally farther than the conductive layer patterns 72c through 72f formed at an upper portion. The recessed portion 77 may prevent a short circuit between the conductive layer patterns 72c through 72f even if the conductive layer patterns 72c to 72f have the same horizontal distance d4.

The conductive layer pattern 72b may be formed with the pad region PAR extending from a side wall of the interlayer insulating layer patterns 52c through 52f formed at an upper portion. The pad region PAR may include a raised pad portion 78 protruding from a surface of the conductive layer pattern 72b. The raised pad portion 28 may prevent a short circuit between the raised pad portion 78 and the conductive layer pattern 72c because the other end 79b of the raised pad portion 78 is rounded adjacent to the conductive layer pattern 72c.

FIGS. 9A through 9G are partial cross-sectional views illustrating a method of manufacturing a connection region of the vertical semiconductor device 500 of FIG. 8.

Figure 9A:
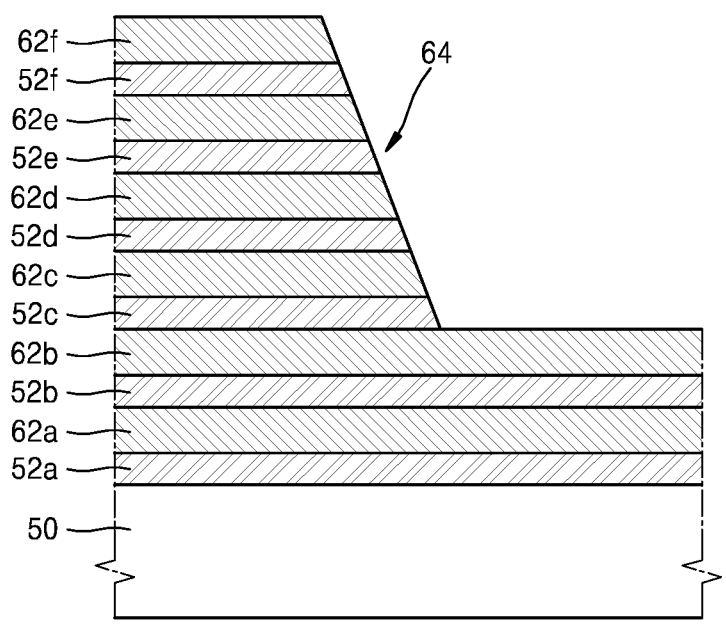
FIGS. 9A through 9G are partial cross-sectional views illustrating a method of manufacturing a connection region of the vertical semiconductor device of FIG. 8.

In more detail, the interlayer insulating layer patterns 52a through 52f and the sacrificial layer patterns 62a through 62f having an inclined portion 64 are formed on the substrate 50 as shown in FIG. 9A. The interlayer insulating layer patterns 52a through 52f and the sacrificial layer patterns 62a through 62f may form the inclined portion 64 through a photolithography process after repeatedly stacking interlayer insulating layers and sacrificial layers on the substrate 50. The photolithography process may be performed several times.

The inclined portion 64 may be formed by performing the photolithography process only on some of the interlayer insulating layer patterns 52a through 52f and the sacrificial layer patterns 62a through 62f. For example, the inclined portion 64 may expose the sacrificial layer pattern 62b by performing the photolithography process on the interlayer insulating layer patterns 52c through 52f and the sacrificial layer patterns 62c through 62f.

The interlayer insulating layer patterns 52a through 52f may be formed of a silicon oxide layer. The sacrificial layer patterns 62a through 62f may be formed of a material having an etching selectivity with the interlayer insulating layer patterns 52a through 62f. The sacrificial layer patterns 62a through 62f may be formed of a material such as a silicon nitride layer or a polysilicon layer. The interlayer insulating layer patterns 52a through 52f and the sacrificial layer patterns 62a through 62f may be formed by a deposition process such as CVD or ALD.

Figure 9B:
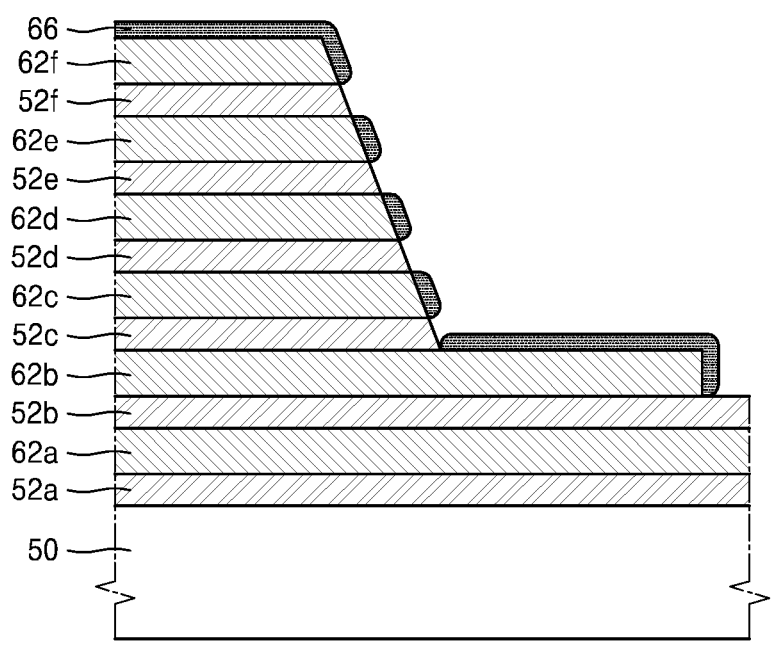

As shown in FIG. 9B, an additional insulating layer 66 is formed by oxidizing surfaces and side surfaces of the sacrificial layer patterns 62b through 62f that are externally exposed. The additional insulating layer 66 may be formed on the surfaces and side surfaces of the sacrificial layer patterns 62b through 62f not covered by the interlayer insulating layer patterns 52a through 52f. The additional insulating layer 66 is covered by the interlayer insulating layer pattern 52b and may not be formed on one side wall of the sacrificial layer pattern 62a.

The additional insulating layer 66 may be formed by thermally oxidizing the surfaces and the side surfaces of the sacrificial layer patterns 62b through 62f. One end of the additional insulating layer 66 may be rounded by an oxidation process. When one end of the additional insulating layer 66 is rounded, one end of each of conductive layer patterns in a subsequent process may be rounded to prevent a short circuit between the conductive layer patterns.

Figure 9C:
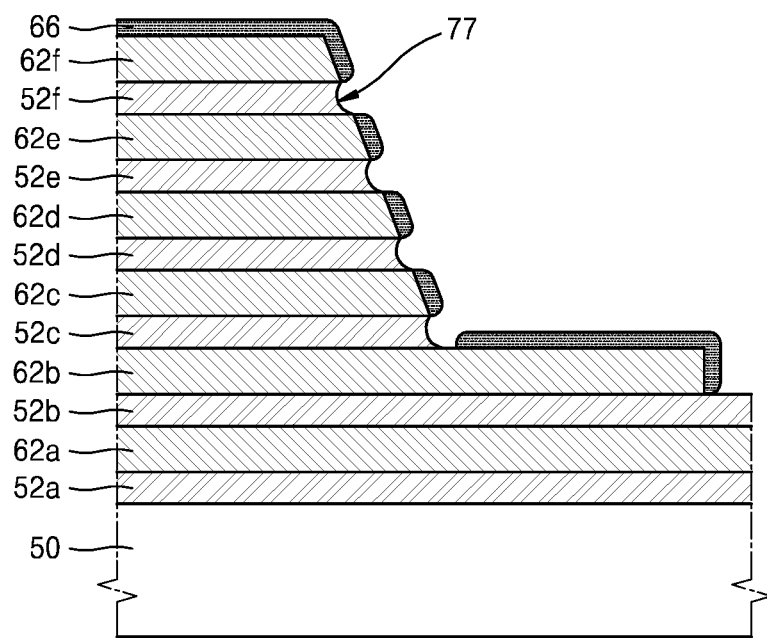

Subsequently, as shown in FIG. 9C, one end of each of the interlayer insulating layer patterns 52c through 52f may be etched to form the recessed portion 77. The recessed portion 77 may not be formed unless needed. The recessed portion 77 may be formed under one end of each of the sacrificial layer patterns 62c through 62f.

The recessed portion 77 may be formed by isotropically etching one end of each of the interlayer insulating layer patterns 52c through 52f. One end of the sacrificial layer pattern 62b may also be etched when forming the recessed portion 77 to increase a distance between one end of the sacrificial layer pattern 62c and one end of the additional insulating layer 66. A short circuit between the subsequent conductive layer patterns may be prevented through the above process.

Figure 9D:
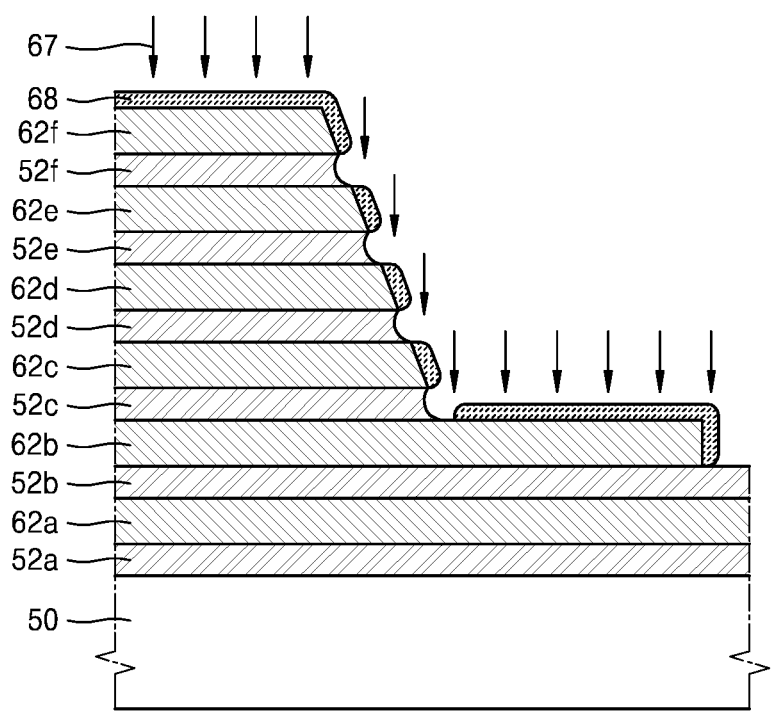

As shown in FIG. 9D, an additional sacrificial layer 68 may be formed by ion implanting impurities 67 into the additional insulating layer 66. The additional sacrificial layer 68 may be an impurity implantation layer into which impurities are implanted. The additional sacrificial layer 68 may be a material layer made by changing physical properties of the additional insulating layer 66. The additional sacrificial layer 68 may be a material layer having a higher etching rate than the additional insulating layer 66.

Figure 9E:
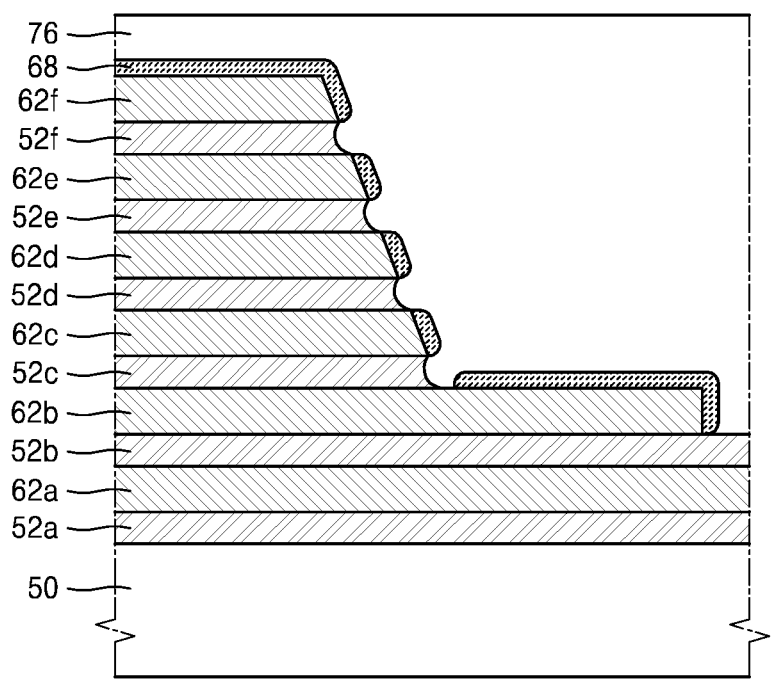
Figure 9F:
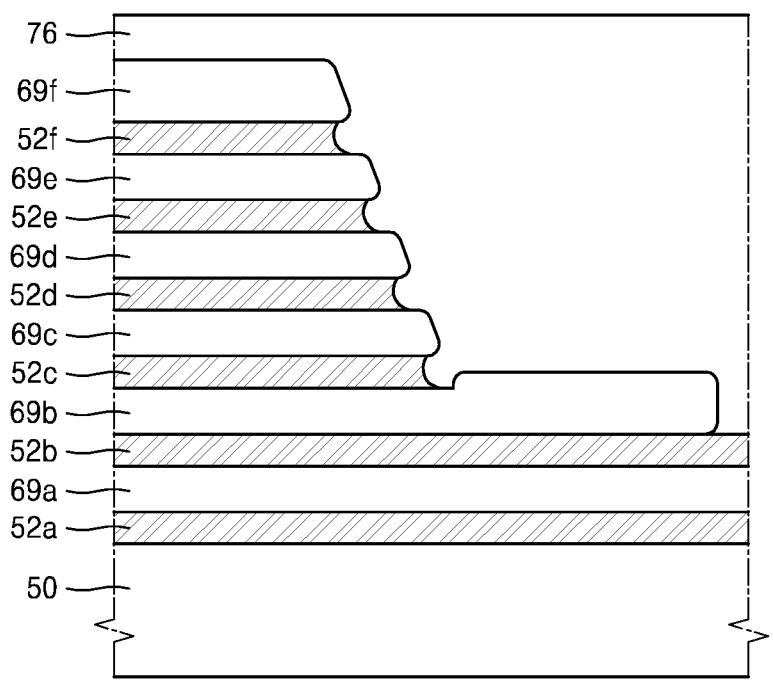

As shown in FIG. 9E, the upper interlayer insulating layer 76 is formed to cover the interlayer insulating layer patterns 52a through 52f and the sacrificial layer patterns 62a through 62f. Subsequently, grooves 69a through 69f are formed by removing the sacrificial layer patterns 62a through 62f and the additional sacrificial layer 68 as shown in FIG. 9F. The grooves 69a through 69f may be located side by side from one ends to the other end of each of the interlayer insulating layer patterns 52a through 52f.

Figure 9G:
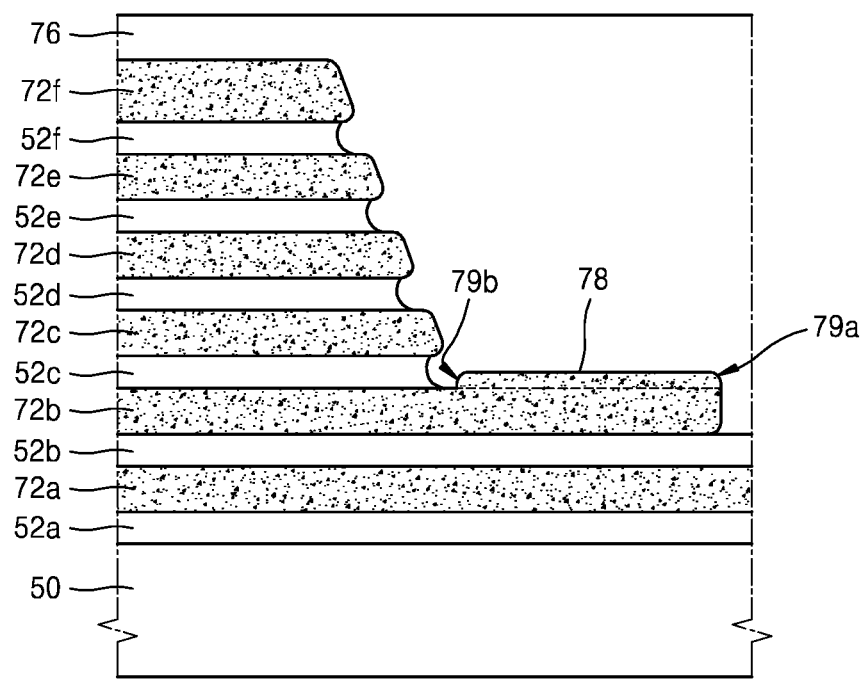

The conductive layer patterns 72a through 72f are formed so as to fill the grooves 69a to 69f as shown in FIG. 9G. The sacrificial layer patterns 62a through 62f and the additional sacrificial layer 68 are replaced with the conductive layer patterns 72a through 72f through the above process. One end of each of the conductive layer patterns 72a through 72f may be rounded. The conductive layer patterns 72a through 72f may include the raised pad portion 78 as described above. The one end 79a and the other end 79b of the raised pad portion 78 are rounded. The upper interlayer insulating layer 76 may be formed to cover the interlayer insulating layer patterns 52a through 52f and the conductive layer patterns 72a through 72f through the replacing process.

Subsequently, the contact plug 84 penetrating the upper interlayer insulating layer 76 to be in contact with the raised pad portion 78 of the conductive layer pattern 72b is formed as shown in FIG. 7, and thus, the connection region CR (of FIGS. 3 and 4) of the vertical semiconductor device 400 may be formed.

Hereinafter, an example embodiment is applied to a vertical semiconductor device having a cell array region CAR that is located on a peripheral circuit region PER will be described. However, this is merely an example, and the example embodiment e is not limited thereto.

Figure 11:
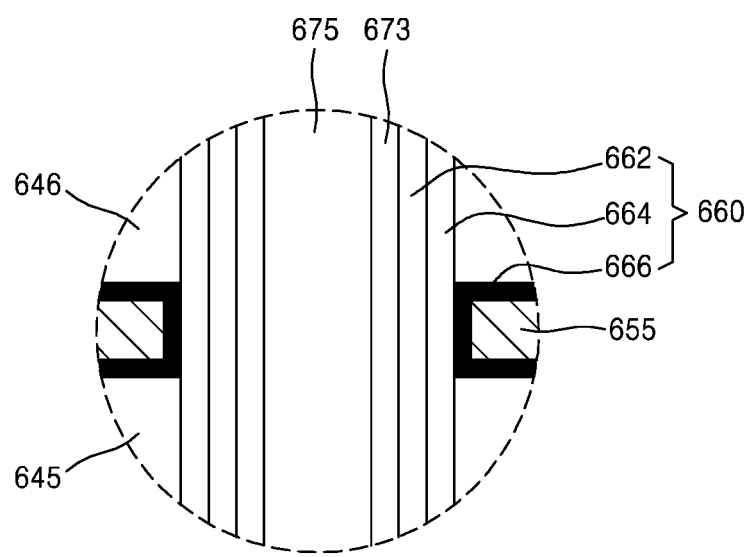
FIG. 11 is a partial enlarged view of FIG. 10.
Figure 12:
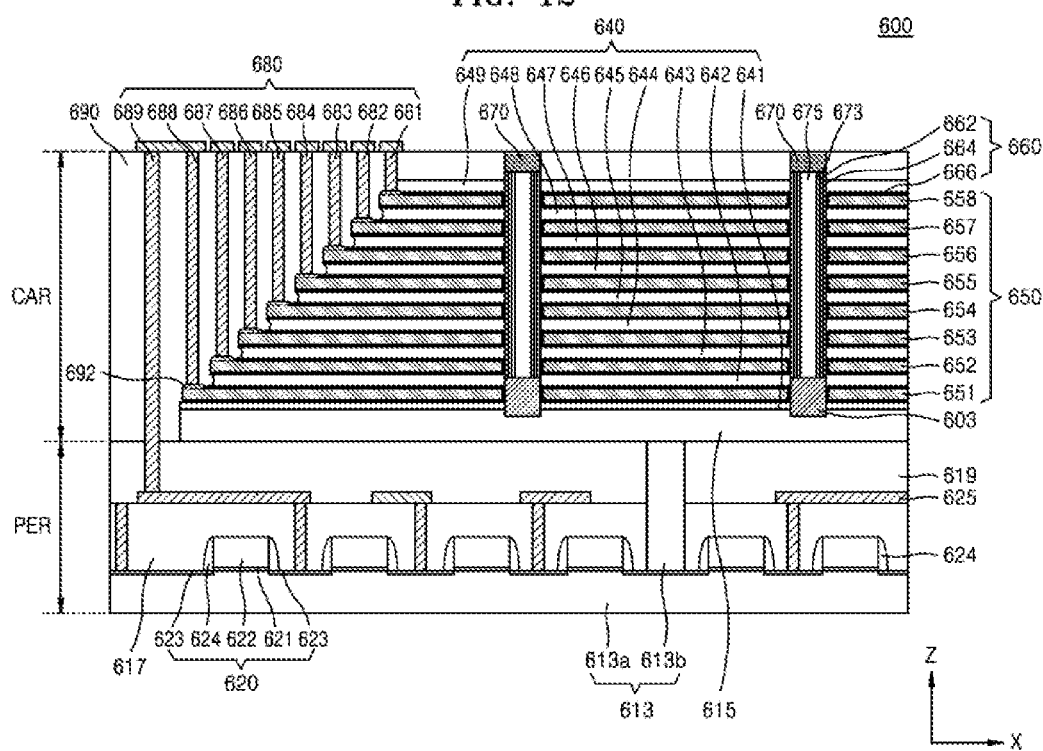
FIG. 12 is a partial cross-sectional view of a vertical semiconductor device according to an example embodiment.

FIG. 10 is a partial perspective view of a vertical semiconductor device 600 according to an example embodiment, FIG. 11 is a partial enlarged view of FIG. 10, and FIG. 12 is a partial cross-sectional view of the vertical semiconductor device 600 according to an example embodiment.

In more detail, the vertical semiconductor device 600 may include a peripheral circuit wiring structure 689 from among wiring structures 680, which is electrically connected to a peripheral circuit on a side of the cell array region CAR. The vertical semiconductor device 600 may include a substrate 613 having a first region 613a and a second region 613b. The vertical semiconductor device 600 may further include a peripheral circuit gate structure 620 formed on the first region 613a of the substrate 613 and first and second interlayer insulating layers 617 and 619.

The peripheral circuit gate structure 620 may include a peripheral circuit gate insulating layer 621, a peripheral circuit gate electrode layer 622, a peripheral circuit spacer 624, and a source/drain region 623. The peripheral circuit gate structure 620 forms a peripheral circuit device. A semiconductor layer 615 may be formed on the first and second interlayer insulating layers 617 and 619 and the second region 613b.

The vertical semiconductor device 600 may include a channel layer 673 arranged in a direction perpendicular to an upper surface of the semiconductor layer 615, a plurality of insulating layers 640 stacked along an external wall of the channel layer 673, and a plurality of gate electrode layers 650. The gate electrode layers 650 may be the conductive layer patterns 22a through 22f described above with reference to FIG. 5.

The gate electrode layer 650 may have a raised pad portion 692 whose one end is rounded and whose surface protrudes from the gate electrode layer 650. The raised pad portion 692 may correspond to the raised pad portion 28 of FIG. 5. The vertical semiconductor device 600 may include a gate insulating layer 660 arranged between the plurality of gate electrode layers 650 and the channel layer 673, and a gap-fill insulating layer 675 may be arranged in the channel layer 673.

The substrate 613 may have an upper surface extending in an X-axis direction (a horizontal direction of the substrate) and a Y-axis direction (a horizontal direction of the substrate). The peripheral circuit gate structure 620 on the upper surface of the first region 613a of the substrate 613 may form the peripheral circuit region PER. That is, the peripheral circuit region PER may be arranged under the cell array region CAR. The substrate 613 may be arranged under the semiconductor layer 615 and the second region 613b of the substrate 613 may contact the semiconductor layer 615.

A wiring layer 625 electrically connected to the peripheral circuit gate structure 620 may be formed on the first region 613a of the substrate 613. The peripheral circuit gate structure 620 may include a horizontal transistor. The first region 613a of the substrate 613 may extend in a direction perpendicular to the upper surface of the first region 613a and may contact a lower surface of the second region 613b. The first region 613a and the second region 613b may be provided by removing a part of a surface of the substrate 613 by an etching process or the like.

After the peripheral circuit gate structure 620 is formed on the first region 613a, the first and second interlayer insulating layers 617 and 619 and the wiring layer 625 may be formed on the peripheral circuit gate structure 620. The first and second interlayer insulating layers 617 and 619 may be formed of a High Density Plasma (HDP) oxide layer to efficiently fill a space between peripheral circuit gate structures 620. In an example embodiment, an amorphous silicon layer (not shown) is formed on the second interlayer insulating layer 619 to contact the second region 613b, and the amorphous silicon layer may undergo mono-crystallization due to the second region 613b.

The channel layer 673 may be arranged on an upper surface of the semiconductor layer 615 so as to extend in a direction perpendicular to the upper surface of the semiconductor layer 615 (a Z-axis direction). The channel layer 673 may be formed in an annular shape surrounding the inner gap-fill insulating layer 675, but may have a columnar shape or a prismatic shape without the gap-fill insulating layer 675, according to an example embodiment. Accordingly, the vertical semiconductor device 600 may include the channel layer 673 and the gap-fill insulating layer 675 to form a vertical structure.

Channel layers 673 may be spaced apart from each other in the X-axis direction and the Y-axis direction. An arrangement of the channel layers 673 may vary according to an example embodiment, and may be arranged, for example, in a zigzag form in at least one direction. The arrangement of the channel layers 673 adjacent to each other with a separation insulating layer 607 therebetween may be symmetrical as shown, but is not limited thereto.

The channel layer 673 may be in direct contact with and electrically connected to the semiconductor layer 615 at a lower surface. The channel layer 673 may include a semiconductor material such as polysilicon or single crystal silicon, and the semiconductor material may be an undoped material or a material including a p-type or n-type impurity. A plurality of gate electrode layers 651 through 658 (650) may be arranged along a side surface of the channel layer 673 and away from the semiconductor layer 615 in the Z-axis direction (a vertical direction of the substrate).

As described above, each of the plurality of gate electrode layers 650 may form a word line, a string selection line, and a ground selection line of the ground selection transistor GST, the plurality of memory cells MC1 through MCn, and the string selection transistor SST. The gate electrode layer 650 may extend to form the word lines WL1 through WLn and may be connected in common to adjacent memory cell strings of a predetermined unit arranged in the X-axis direction and the Y-axis direction.

In an example embodiment, gate electrode layers 652 through 657 of the memory cells MC1 through MCn are shown as being arranged in six, but this is merely an example and the number of the gate electrode layers 652 through 657 forming the memory cells MC1 to MCn may be determined according to capacity of the semiconductor chip 1100.

For example, the number of gate electrode layers 652 through 657 forming the memory cells MC1 through MCn may be 2n (n is a natural number). The gate electrode layer 651 of the ground selection transistor GST may form the ground selection line GSL. The gate electrode layer 658 of the string selection transistor SST may form the string selection line SSL. In particular, the gate electrode layer 658 of the string selection transistor SST may be formed to be divided between adjacent memory cell strings to form different string selection lines SSL.

According to an example embodiment, the gate electrode layer 658 of the string selection transistor SST and the gate electrode layer 651 of the ground selection transistor GST each may be two or more, and may have a different structure from the gate electrode layers 652 through 657 of the memory cells MC1 through MCn.

The plurality of gate electrode layers 650 may include a polysilicon material or a metal silicide material. The metal silicide material may be, for example, a silicide material of a metal selected from cobalt (Co), nickel (Ni), hafnium (Hf), platinum (Pt), tungsten (W), and titanium (Ti). According to an example embodiment, the plurality of gate electrode layers 650 may include a metal material such as W.

A plurality of insulating layers 641 through 649 (640) may be arranged between the plurality of gate electrode layers 650. The plurality of insulating layers 640 may be arranged to be spaced apart from each other in the Z-axis direction and to extend in the X-axis direction like the plurality of gate electrode layers 650. The plurality of insulating layers 640 may include an insulating material such as silicon oxide or silicon nitride.

The gate insulating layer 660 may be arranged between the plurality of gate electrode layers 650 and the channel layer 673. The gate insulating layer 660 may include a tunnel insulating layer 662, a charge storage layer 664, and a blocking insulating layer 666 that are sequentially stacked from the channel layer 673. The tunnel insulating layer 662 may tunnel a charge to the charge storage layer 664 by using an F-N method. The tunnel insulating layer 662 may include, for example, silicon oxide, hafnium oxide, aluminum oxide, zirconium oxide, tantalum oxide, or the like.

The charge storage layer 664 may be a charge trap layer or a floating gate conductive layer. For example, the charge storage layer 664 may include dielectric materials, quantum dots, or nanocrystals. Here, the quantum dots or nanocrystals may include fine particles of a conductor, for example, metal or a semiconductor. The charge storage layer 664 may include silicon nitride, boron nitride, silicon boron nitride, or impurity-doped polysilicon.

The blocking insulating layer 666 may include a dielectric material having a high-dielectric constant (high-k). The dielectric material having a high-k refers to a dielectric material having a high-k than a silicon oxide layer. The blocking insulating layer 666 may include a single layer or a stacked layer of silicon oxide, silicon nitride, hafnium oxide, aluminum oxide, zirconium oxide, tantalum oxide, or the like.

A drain region 670 may be disposed at an upper end of a memory cell string to cover an upper surface of the gap-fill insulating layer 675 and electrically connected to the channel layer 673. The drain region 670 may include, for example, doped polysilicon. The drain region 670 may act as a drain region of the string selection transistor SST.

Meanwhile, source regions 605 of the ground selection transistors GST arranged in the X-axis direction may be disposed at a lower end of the memory cell string. The source regions 605 may extend in the X-axis direction adjacent to the upper surface of the semiconductor layer 615, and may be spaced apart from each other by a predetermined unit in the Y-axis direction.

For example, the source regions 605 may be arranged in the Y-axis direction one by one for every two of the channel layers 673, but is not limited thereto. The separation insulating layer 607 may be formed on the source regions 605. When the source regions 605 have a conductivity type opposite to that of the semiconductor layer 615, the source regions 605 may act as source regions of adjacent ground selection transistors GST and may be connected to the common source line CSL.

The plurality of gate electrode layers 650 and the plurality of insulating layers 640 may be formed to extend in different lengths along the X-axis direction (a horizontal direction of the substrate). The plurality of interconnect structures 680 electrically connected to at least some of the gate electrode layers 650 and the plurality of peripheral circuit gate structures 620 are shown. The wiring structures 680 may include contact plugs 681 through 688 formed in a pad insulating layer 690 and an upper wiring layer on the contact plugs 681 through 688. A short-circuit may not occur between the upper contact plugs 681 through 688 and the lower contact plugs 681 through 688 due to the raised pad portion 692 on the gate electrode layer 650.

The vertical semiconductor device 600 may have the peripheral circuit region PER including the peripheral circuit gate structure 620 and the wiring layer 625 arranged under the cell array region CAR. Accordingly, regions in the X-axis and Y-axis directions for forming the peripheral circuit region PER may be reduced, thereby increasing integration density of the vertical semiconductor device 600 and reducing a chip size.

The plurality of gate electrode layers 650 and the plurality of insulating layers 640 may extend in different lengths along the X-axis direction and at least some of the gate electrode layers 650 and the plurality of peripheral circuit gate structures 620 may be electrically connected to the wiring structures 680.

The wiring structure 689 of the wiring structures 680 may be a peripheral circuit wiring structure electrically connected to peripheral circuits. The wiring structures 681 through 688 of the wiring structures 680 may be a wiring structure electrically connected to memory cells of the cell array area CAR.

A vertical semiconductor device may repeatedly stack interlayer insulating layer patterns and conductive layer patterns on a substrate in a vertical direction. One ends of some of the conductive layer patterns are rounded to prevent a short circuit between adjacent conductive layer patterns.

The vertical semiconductor device may include a pad region in which some of the conductive layer patterns extend from a side wall of the interlayer insulating layer patterns. The pad region may include a raised pad portion protruding from a surface of each of the conductive layer patterns. Thus, the vertical semiconductor device may easily form a contact plug in the raised pad portion.

While the inventive concept has been particularly shown and described with reference to example embodiments thereof, it will be understood that various changes in form and details may be made therein without departing from the spirit and scope of the following claims.

What is claimed is:

1. A vertical semiconductor device comprising:
a plurality of interlayer insulating layer patterns spaced apart from each other on a substrate and stacked in a vertical direction;
a plurality of conductive layer patterns arranged between the interlayer insulating layer patterns, wherein the conductive layer patterns include a first conductive layer pattern near the substrate and second conductive layer patterns farther away from the substrate, and the first conductive layer pattern is configured to extend from one side wall of an adjacent interlayer insulating layer pattern, and includes a pad region having a raised pad portion protruding from a surface of the first conductive layer pattern;
an upper interlayer insulating layer covering the interlayer insulating layer patterns and the conductive layer patterns; and
a contact plug penetrating the upper interlayer insulating layer to be in contact with the raised pad portion of the first conductive layer pattern,
wherein the horizontal length of the second conductive layer patterns become shorter as the second conductive layer patterns get farther away from the substrate in the vertical direction, and one sidewall of each of the second conductive layer patterns has an inclined portion, and
wherein a first end of the raised pad portion and a second end of the raised pad portion opposite the first end are rounded.

2. The vertical semiconductor device of claim 1, wherein the horizontal length of the first conductive layer pattern is longer than horizontal distances of the second conductive layer patterns.

3. The vertical semiconductor device of claim 1, wherein an imaginary line connected to the sidewalls of the second conductive layer patterns is inclined in the vertical direction.

4. The vertical semiconductor device of claim 1, wherein one end of each of the second conductive layer patterns is rounded.

5. The vertical semiconductor device of claim 4, wherein one upper end of the second conductive layer patterns and one lower end of each of the second conductive layer patterns in the vertical direction are rounded.

6. The vertical semiconductor device of claim 1, wherein the conductive layer patterns further comprises a third conductive layer pattern below the first conductive layer pattern.

7. The vertical semiconductor device of claim 1, wherein the second end of the raised pad portion extends farther in a horizontal direction in which the first conductive layer pattern extends than an adjacent interlayer insulating layer pattern, and the raised pad portion is configured to occupy, from a top-down view, a portion exposed by the second conductive layer patterns.

8. The vertical semiconductor device of claim 1, wherein the upper surface of the raised pad portion is positioned between a lower surface of an adjacent second conductive layer pattern and an upper surface of the first conductive layer pattern.

9. The vertical semiconductor device of claim 1, wherein some of the interlayer insulating layer patterns comprise a recessed portion recessed from one end of respective adjacent second conductive layer patterns.

10. The vertical semiconductor device of claim 9, wherein each recessed portion is filled with the upper interlayer insulating layer.

11. The vertical semiconductor device of claim 1, wherein the second end of the raised pad portion is separated from the first end of the raised pad portion in a horizontal direction in which the first conductive layer pattern extends.

12. A vertical semiconductor device comprising:
a vertical structure protruding in a vertical direction on a substrate of a cell block region and including a channel layer;
a plurality of conductive layer patterns stacked while being spaced apart from each other by a plurality of interlayer insulating layer patterns in the vertical direction; and
a contact plug in contact with a pad region which is at an edge of a first conductive layer pattern of the conductive layer patterns, the pad region including a raised pad portion protruding from a surface of the first conductive layer pattern,
wherein second conductive layer patterns of the conductive layer patterns have an inclined form in which the horizontal distances from the vertical structure to an end of second conductive layer patterns become shorter as the second conductive layer patterns get farther away from the substrate in the vertical direction, and one end of each of the second conductive layer patterns is rounded, and
wherein a first interlayer insulating layer pattern of the interlayer insulating patterns comprises a recessed portion recessed from one end of respective adjacent second conductive layer patterns.

13. The vertical semiconductor device of claim 12, wherein the conductive layer patterns are a word line, a string selection line, or a ground selection line.

14. The vertical semiconductor device of claim 12, wherein one end and an other end of the raised pad portion are rounded.

15. The vertical semiconductor device of claim 12, wherein the raised pad portion includes a first end and a second end opposite the first end, the second end of the raised pad portion is separated from the first end of the raised pad portion in a horizontal direction in which the first conductive layer pattern extends, and the first end of the raised pad portion is separated from an adjacent recessed portion in a horizontal direction in which the first conductive layer pattern extends.

16. The vertical semiconductor device of claim 12, wherein the upper surface of the raised pad portion is positioned between a lower surface of an adjacent second conductive layer pattern and an upper surface of the first conductive layer pattern.

17. A vertical semiconductor device, comprising:
a plurality of conductive layer patterns being stacked in a vertical structure on a substrate and being spaced apart from each other by a plurality of interlayer insulating layer patterns in the vertical direction; and
a contact plug in contact with a pad region which is at an edge of a first conductive layer pattern of the conductive layer patterns,
wherein the edge of the first conductive layer pattern includes a raised pad portion in the pad region and through which the contact plug passes, and the raised pad portion is rounded on opposite sides of the contact plug on the first conductive layer pattern,
wherein second conductive layer patterns of the conductive layer patterns have an inclined form in which the horizontal distances become shorter as the second conductive layer patterns get farther away from the substrate in the vertical direction.

18. The vertical semiconductor device of claim 17, wherein some of interlayer insulating layer patterns comprise a recessed portion recessed from one end of an adjacent second conductive layer pattern, and one end of each of the second conductive layer patterns is rounded.

19. The vertical semiconductor device of claim 17, wherein the upper surface of the raised pad portion is positioned between a lower surface of an adjacent second conductive layer pattern and an upper surface of the first conductive layer pattern.

20. The vertical semiconductor device of claim 17, wherein one sidewall of each of the second conductive layer patterns has an inclined portion.

* * * * *